United States Patent [19]

Sangster

[11] 4,411,010
[45] Oct. 18, 1983

[54] DIVIDE-BY-TWO CHARGE DIVIDER

[75] Inventor: Frederik L. J. Sangster, Eindhoven, Netherlands

[73] Assignee: U.S. Philips Corporation, New York, N.Y.

[21] Appl. No.: 246,476

[22] Filed: Mar. 23, 1981

[30] Foreign Application Priority Data

Mar. 25, 1980 [NL] Netherlands ................ 8001730

[51] Int. Cl.³ .................... H03K 13/02; H03K 21/00
[52] U.S. Cl. .................... 377/61; 340/347 AD; 340/347 DA; 340/347 M
[58] Field of Search ............ 340/347 M, 347 DA; 307/221 C, 221 D; 377/61

[56] References Cited

U.S. PATENT DOCUMENTS

| 3,170,153 | 2/1965 | Brooks | 340/347 AD |
| 3,745,383 | 7/1973 | Sangster | 307/221 C X |
| 4,107,550 | 8/1978 | Jacquart et al. | 307/221 D X |
| 4,107,670 | 8/1978 | Hornak | 340/347 DA |

OTHER PUBLICATIONS

Bernadotte et al., Bucket Brigade Devices Arranged for Dividing Analog..., IBM Technical Disclosure Bulletin, vol. 18, No. 8, 1/76, p. 2540.

Primary Examiner—T. J. Sloyan
Attorney, Agent, or Firm—James J. Cannon, Jr.

[57] ABSTRACT

In order to generate binary weighted charges an input charge is distributed between two parallel branches via CTD's. In order to correct the errors as a result of this division, the divided charges are subsequently transferred alternately via further CTD's, either in the same or to the other branch.

1 Claim, 3 Drawing Figures

DIVIDE-BY-TWO CHARGE DIVIDER

BACKGROUND OF THE INVENTION

1. Field of the Invention

The invention relates to a device for the repeated division of electric charges into equal halves for use in analog-to-digital or digital-to-analog converters, employing clock-pulse controlled charge-transfer devices.

2. Description of the Prior Art

The IEEE JL. SSC of December 1975, pages 371 and further and December 1976, pages 772 and further, describe devices for analog-to-digital (ADC) and digital-to-analog (DAC) conversion, in which it is attempted to repeatedly divide a charge into halves by means of a series of capacitors with binary weighted values. This presents problems in accurately realizing the correct capacitance values, which is decisive for the accuracy with which the relevant charge division is effected.

SUMMARY OF THE INVENTION

The invention is characterized in that an input charge is applied to two parallel branches, which branches each comprise a charge transfer device and a storage capacitance, to which capacitances half the input charge can be fed by means of the charge transfer devices with an inaccuracy which is determined by the inequality of the charge transfer devices, each of the storage capacitances being coupled to two further alternately operative charge transfer devices, of which the one device transfers a charge stored in the storage capacitance of one of said branches to a collecting capacitance situated in the same branch, while the other one of the further charge transfer devices transfers said a charge to a collecting capacitance situated in the other branch.

The invention is based on the concept that for converting a digital into an analog signal with the aid of a charge transfer device (CTD), such as a bucket brigade device (BBD) or charge coupled device (CCD), it is simply possible to distribute charges among parallel branches with for example equal capacitors (known per se from IBM Techn. Discl. Bull., January 1976, pages 2540) and to obtain a series of binary weighted charges according to this principle. The charges of this series, of which the bit of corresponding weight of the digital input signal is for example "1", are added, so that an overall charge is obtained which is the analog equivalent of the digital signal. For the conversion of analog into digital signals the output of a DAC as described in the foregoing may be compared with the analog input signal and from the difference of the two the digital control of the CTD's may be derived, which then yields the digital signal.

A major advantage of the use of parallel branches in comparison with the prior art known from the aforementioned articles in IEEE JL. SSC, is that now, if desired, capacitors with equal or nearly equal capacitance values may be used, so that the number of bits of the DAC or ADC, in comparison with the said known devices, could be extended substantially. However, the conversion accuracy then also remains dependent on the accuracy with which the CTD's in the two parallel branches are identical to each other. However, said inequality has no consequences owing to the use of the aforementioned further charge transfer devices, as will become apparent hereinafter.

BRIEF DESCRIPTION OF THE DRAWINGS

The invention will now be described in more detail with reference to the drawing, in which.

DESCRIPTION OF THE PREFERRED EMBODIMENT

Figure 1:
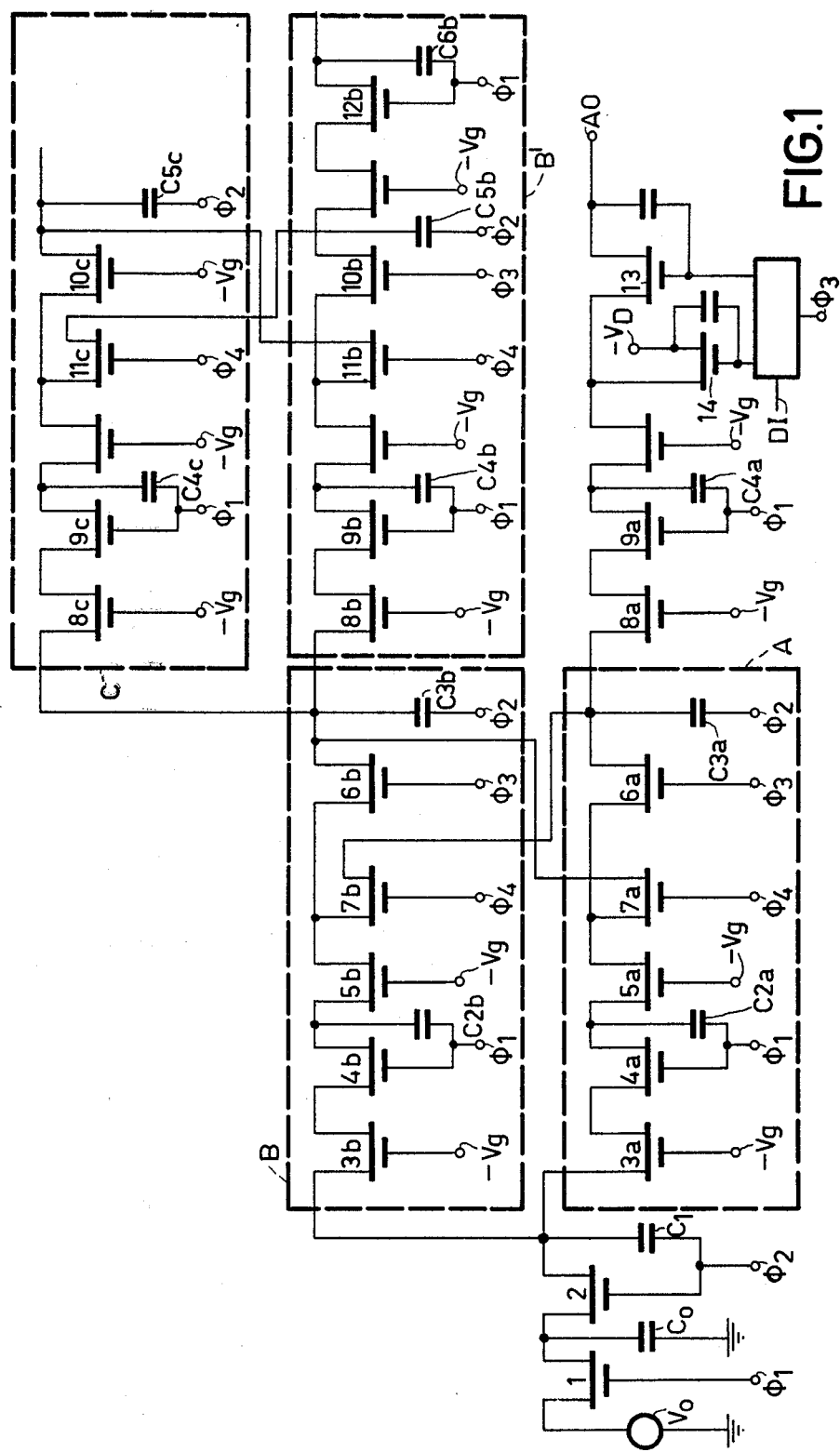
FIG. 1 illustrates the principle of the invention.
Figure 2:
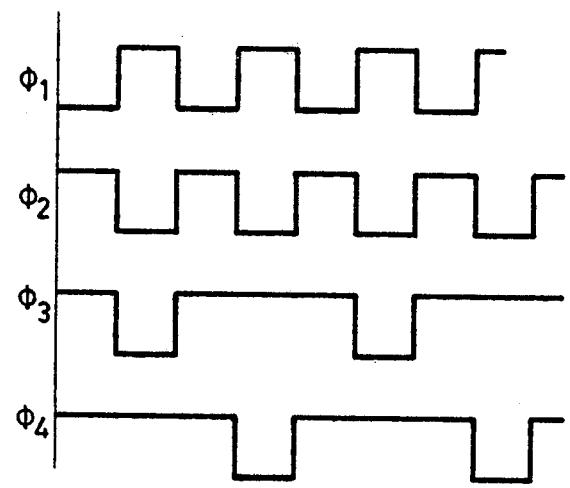
FIG. 2 represents voltage-time diagrams of the clock pulses employed in FIG. 1

In the device of FIG. 1 a source of constant voltage $V_O$ charges a capacitor $C_O$ via a transistor 1 which is controlled by the clock pulse $\phi_1$, specifically an insulated gate field-effect transistor (IGFET), so that a given charge Q is stored in said capacitor. By means of a charge transfer device in this case a transfer gate, comprising a transistor 2 controlled by a clock pulse $\phi_2$ most of this charge is transferred to the storage capacitance $C_1$, after which it is applied to two parallel branches A and B respectively, each comprising an isolating transistor 3a and 3b respectively operated alternately, a transfer gate, comprising a transistor 4a and 4b respectively, and a storage capacitance C2a and C2b respectively. The transistors 4a and 4b are also controlled by the clock pulse $\phi_1$. If the transistors 3a and 3b and 4a and 4b would have exactly the same properties, specifically the same threshold voltages and channel resistances (the capacitances C2a and C2b need not be exactly equal), then at the instant at which by means of the clock pulse $\phi_1$ the charge Q on the capacitance $C_1$ is transferred to the capacitances C2a and C2b via the transistors 4a and 4b respectively, each of the last-mentioned capacitances would contain exactly the charge ½Q. However, in practice this requirement cannot be met, especially not by means of an integrated circuit version, where it is already difficult to obtain mutual differences below 1%.

Via the isolating transistors 5a and 5b, respectively, which are operated alternately, the capacitances C2a and C2b, in accordance with the further characteristic feature of the invention, are each followed by two transfer gates comprising the transistors 6a and 7a and 6b and 7b respectively and the collecting capacitances C3a and C3b respectively. The clock pulses $\phi_3$ and $\phi_4$ applied to these transfer gates and the clock pulse $\phi_2$, which is simultaneously applied to the lower side of the capacitances C3a and C3b respectively, ensure that either the transfer gates 6a and 6b or the transfer gates 7a and 7b are operative. (Thus, in contradistinction to the said article in IBM-TDB no direct connection is established between the upper sides of the capacitances C2a and C2b). As a result of this, the charges of the capacitances C2a and C2b are alternately transferred to the collecting capacitances C3a and C3b respectively during the clock pulse phase $\phi_3$ and to the collecting capacitances C3b and C3a respectively during the clock pulse phase $\phi_4$. If the first-mentioned charges are ½Q(1+x) and ½Q(1−x) respectively, in which x represents the deviation as a result of the inequality of the transfer gates specifically of the transistors 3a and 4a respectively and 3b and 4b respectively, each of the collecting capacitances C3a and C3b will alternately receive the charge ½Q(1+x) and ½Q(1−x). The capacitance C3a, via an isolating transistor 8a operated in cascade, is connected to a transfer gate comprising a transistor 9a connected to a storage capacitance C4a, which is again controlled by the clock pulses $\phi_1$. Thus, the sum of the two above-mentioned charges, i.e. a charge Q, will be obtained at the capacitance C4a.

Figure 3:
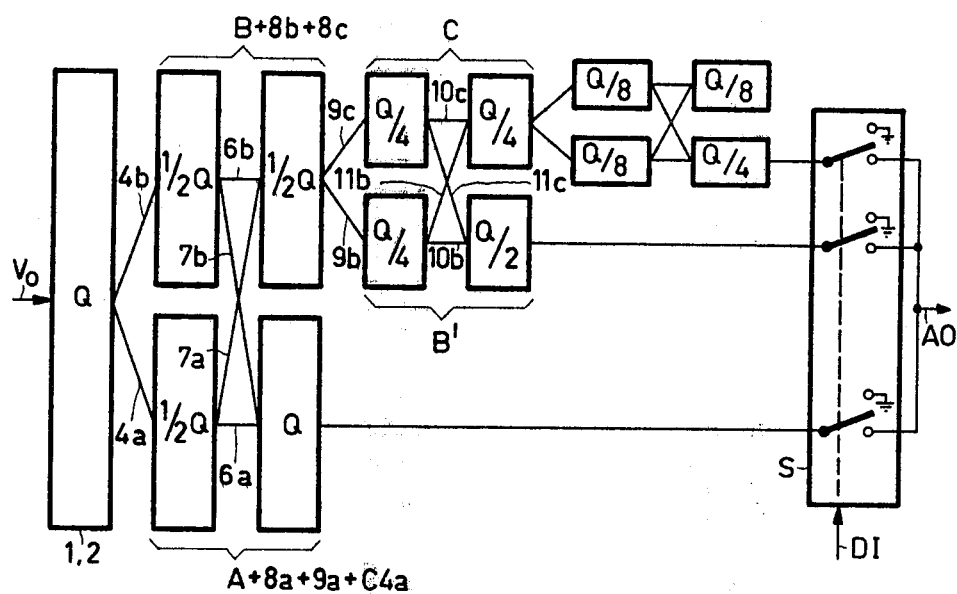
FIG. 3 illustrates the combination of devices in accordance with FIG. 1 to a digital-to-analog converter.

Thus, the steps described so far apparently seem to have no effect, because from the charge Q on the capacitance $C_1$ an equal charge on the capacitance C4a has been derived. However, from the following it will appear that actually some progress is made. The capacitance C3b, in its turn, is followed by two parallel branches B' and C which are identical to the branches A and B, i.e. the capacitance C3b is connected to transfer gates via isolating transistors 8b and 8c respectively, which correspond to the previously described transistors 3a and 3b respectively, which transfer gates comprise the transistors 9b and 9c (corresponding to the transistors 4a and 4b respectively) and are connected to the storage capacitances C4b and C4c respectively (corresponding to C2a and C2b respectively) etc. This is schematically represented in FIG. 3.

In this Figure the block 1, 2 corresponds to the circuit elements 1 and 2 of FIG. 1, by means of which the charge Q is derived from the voltage $V_O$. The branches 4a and 4b, corresponding to the relevant transfer gates of FIG. 1, divide said charges into approximately equal halves $\frac{1}{2}Q$, while the branches 6a, 6b, 7a and 7b correspond to the relevant "further" CTD's of FIG. 1. If the errors introduced in the charge division by the transfer gates 3a, 4a, 3b, 4b and 8a, 9a, 8b, 9b etc. are $x_1$ and $x_2$ respectively etc. a charge $\frac{1}{2}Q(1+x_1)$ will arrive at the capacitance C3b during the clock pulse phase $\phi_3$ and a charge $\frac{1}{2}Q(1-x_1)$ during the clock pulse phase $\phi_4$. Under the influence of the clock pulse $\phi_1$ on the transfer gates 9b, C4b and 9c, C4c this charge is again divided into approximately equal halves with an error $x_2$, so that during the clock pulse phase $\phi_3$ a charge $\frac{1}{4}Q(1+x_1-x_2)$ will arrive at the capacitance C4b, and a charge $\frac{1}{4}Q(1-x_1-x_2)$ at the capacitance C4c, while during the clock pulse phase $\phi_4$ a charge $\frac{1}{4}Q(1-x_1-x_2)$ will arrive at the capacitance C4b and a charge $\frac{1}{4}Q(1-x_1+x_2)$ at the capacitance C4c. The transfer gates 10b, 11b and 10c, 11c respectively (corresponding to the transfer gates 6a C3a, 7a C3b and 6b C3b, 7b C3a respectively) following said capacitances ensure that during the clock pulse phase $\phi_3$ the charge then present is further transferred via the branches 10b and 10c. The result is that the charges $\frac{1}{4}Q(1+x_1-x_2)$ and $\frac{1}{4}Q(1-x_1+x_2)$ are added at the storage capacitance C6b of the branch B' and thus an error-free charge $\frac{1}{2}Q$ is obtained (when ignoring second-order effects).

In a similar way the branch C is followed by two parallel branches C' and D (corresponding to the branches B' and C) etc., by means of which error-free charge packets Q/4, Q/8 can be obtained. These charges are applied to a summing device S controlled by a digital input signal DI, which device comprises a plurality of electronic two-way switches, which depending on the value of DI transfer the relevant charge either to the analog output A0 or to ground. (In FIG. 1 one of these two-way switches is represented by the transistors 13 and 14 respectively, the clock pulse $\phi_3$ being applied to the transistor 13 or 14 depending on the value of DI).

Where in the foregoing there is mention of capacitances, it will be evident that for these capacitances it is possible to utilize internal capacitances of a semiconductor body, such as occur in CCD's, PCCD's, etc.

The use of IGFET's operated in cascade (2, 3a, 3b, 5a, 5b, etc.) i.e. the source electrode used as input (on the left in the Figure), the gate electrode at a fixed potential (ground) and the drain electrode as output (on the right in the Figure), has the advantage of a better charge transfer efficiency; the cascade IGFET's 5a, 5b etc. preceding the "further" CTD's moreover have the advantage that any errors introduced by threshold voltage differences of the transistors 6a and 7a and 6b and 7b are avoided. The charge transferred from the capacitor C2a to the respective capacitors C3a and C3b by the transfer gates 6a and 7a respectively then virtually depends only on the threshold voltage of the transistor 5a and is no longer influenced by the efficiency of the CTD's 6a and 7a respectively.

In general the steps described will be mainly applied to the more significant bits of a digital-to-analog converter, because for the less significant bits, i.e. the bits which differ by a great division factor from the charge Q, said errors are no longer of significance.

What is claimed is:

1. A device for the repeated division of electric charges into equal halves for use in analog-to-digital or digital-to-analog converters, employing clock pulse controlled charge transfer devices, wherein an input charge is applied to a first and to a second branch, which branches are parallel and which branches each include a first charge transfer device and a first storage capacitance, to which first storage capacitance half the input charge can be fed by means of said charge transfer device with an inaccuracy which is determined by the inequality of the storage capacitance and/or of the charge transfer devices, said first charge transfer devices being controlled by first clock pulses characterized in that:

each of said branches has a second and a third alternately operative charge transfer device coupled to said storage capacitance;

said second transfer device transferring the charge stored in the storage capacitance in a given branch to a collecting capacitance situated in the other branch and said third transfer device transferring the charge stored in the storage capacitance in a given branch to a collecting capacitance situated in the same branch;

said second and said third transfer devices are controlled respectively by second and third clock pulses, said second and third clock pulses having a rate half of the rate of said first clock pulses and being interlaced with said first clock pulses;

said first clock pulses further controlling a transfer gate connected to a collecting capacitance of a first branch for transferring charges of said collecting capacitance to a second storage capacitance for summing the charges transferred to said collecting capacitance by each pair of successive second and third clock pulses.

* * * * *